United States Patent
Bijnen et al.

(10) Patent No.: US 9,046,385 B2
(45) Date of Patent: Jun. 2, 2015

(54) ALIGNMENT MEASUREMENT SYSTEM, LITHOGRAPHIC APPARATUS, AND A METHOD TO DETERMINE ALIGNMENT IN A LITHOGRAPHIC APPARATUS

(75) Inventors: Franciscus Godefridus Casper Bijnen, Valkenswaard (NL); Sami Musa, Veldhoven (NL); David Deckers, Schilde (BE)

(73) Assignee: ASML Netherlands B.V., Veldhoven (NL)

( * ) Notice: Subject to any disclaimer, the term of this patent is extended or adjusted under 35 U.S.C. 154(b) by 884 days.

(21) Appl. No.: 13/206,592

(22) Filed: Aug. 10, 2011

(65) Prior Publication Data
US 2012/0062863 A1    Mar. 15, 2012

Related U.S. Application Data

(60) Provisional application No. 61/382,147, filed on Sep. 13, 2010.

(51) Int. Cl.
| | | |
|---|---|---|
| *G01B 11/00* | (2006.01) | |
| *G01J 4/00* | (2006.01) | |
| *G01D 5/34* | (2006.01) | |
| *G03F 9/00* | (2006.01) | |

(52) U.S. Cl.
CPC .............. *G01D 5/344* (2013.01); *G03F 9/7088* (2013.01)

(58) Field of Classification Search
CPC ............. G03F 9/7049; G03F 9/7088; G03F 2009/005; G03F 9/00; G03F 9/70
USPC ........ 356/399–401, 369, 509; 355/53, 67, 77; 250/559.29, 237, 559.3
See application file for complete search history.

(56) References Cited

U.S. PATENT DOCUMENTS

| | | | |
|---|---|---|---|
| 4,770,532 A | 9/1988 | Ito | |
| 5,182,610 A | 1/1993 | Shibata | |
| 6,445,453 B1 | 9/2002 | Hill | |
| 6,535,272 B2 | 3/2003 | Ota et al. | |
| 6,844,918 B2 | 1/2005 | Navarro Y Koren et al. | |
| 6,891,627 B1 * | 5/2005 | Levy et al. | 356/625 |
| 7,642,536 B2 | 1/2010 | Baer | |

(Continued)

FOREIGN PATENT DOCUMENTS

| | | |
|---|---|---|
| JP | 62-211503 A | 9/1987 |
| JP | 63-005203 A | 1/1988 |

(Continued)

OTHER PUBLICATIONS

Goda, K., et al., "Serial time-encoded amplified imaging for real-time observation of fast dynamic phenomena," Nature, vol. 458, Apr. 30, 2009; pp. 1145-1150.

*Primary Examiner* — Peter B Kim
*Assistant Examiner* — Michelle Iacoletti
(74) *Attorney, Agent, or Firm* — Sterne, Kessler, Goldstein & Fox P.L.L.C

(57) ABSTRACT

An alignment measurement system measures an alignment target on an object. A measurement illuminates the target and is reflected. The reflected measurement beam is split and its parts are differently polarized. A detector receives the reflected measurement beam. A processing unit determines alignment on the basis of the measurement beam received by the detector. An alternative arrangement utilizes an optical dispersive fiber to guide a multi-wavelength measurement beam reflected from the object to a detector.

13 Claims, 4 Drawing Sheets

(56) References Cited

U.S. PATENT DOCUMENTS

| | | |
|---|---|---|
| 2003/0095265 A1* | 5/2003 | Hill ............................ 356/493 |
| 2005/0122515 A1* | 6/2005 | Borden et al. ............... 356/369 |
| 2006/0117293 A1 | 6/2006 | Smith et al. |
| 2008/0198380 A1* | 8/2008 | Straaijer et al. ............. 356/369 |

FOREIGN PATENT DOCUMENTS

| | | |
|---|---|---|
| JP | 04-148808 A | 5/1992 |
| JP | 05-040026 A | 2/1993 |
| JP | 05-087528 A | 4/1993 |
| JP | 07-239212 A | 9/1995 |
| JP | 09-293663 A | 11/1997 |
| JP | 2002-350117 A | 12/2002 |
| JP | 2003-506741 A | 2/2003 |
| JP | 2006-157023 A | 6/2006 |
| JP | 2007-335906 A | 12/2007 |
| JP | 2008-534990 A | 8/2008 |
| JP | 2009-064024 A | 3/2009 |

* cited by examiner

ALIGNMENT MEASUREMENT SYSTEM, LITHOGRAPHIC APPARATUS, AND A METHOD TO DETERMINE ALIGNMENT IN A LITHOGRAPHIC APPARATUS

CROSS REFERENCE TO RELATED APPLICATIONS

This application claims benefit under 35 U.S.C. 119(e) to U.S. Provisional Application No. 61/382,147, filed Sep. 13, 2010, which is incorporated by reference herein in its entirety.

BACKGROUND

1. Field of the Invention

The invention relates to alignment measurement in lithographic apparatus.

2. Description of the Related Art

A lithographic apparatus applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) of a substrate (e.g. a silicon wafer). Transfer of the pattern includes imaging the pattern onto a layer of radiation-sensitive material (resist) provided on the substrate. In general, a single substrate will contain a network of adjacent target portions that are successively patterned. Conventional lithographic apparatus include "steppers", in which each target portion is irradiated by exposing an entire pattern onto the target portion at once, and "scanners", in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It is important that a substrate is properly aligned with the projection system and the patterning device. In practice, multiple patterns may be projected on top of each other to obtain a three dimensional product structure. These multiple patterns should be properly aligned with respect to each other to obtain a reliable product structure. This overlay requirement is increasingly important with increasing resolution.

Several methods and measurement tools are available to measure alignment of the substrate with respect to the projection system and/or the patterning device. Known alignment sensors may use multiple different wavelengths, each with a specific polarization direction. The benefit of using polarization directions is evident when the alignment marks are sub-segmented to create polar marks. These polar marks may use different sub-segmentations in the lines and the spaces of the alignment mark to increase the optical contrast between the lines and the spaces.

Improving alignment by combining multiple colors is starting to be used, for example by using 'smooth-color dynamic' alignment recipes or by doing 'color to color' analysis. These methods aim to improve the measured align position by minimizing the effect of mark asymmetry, but can't improve the signal to noise ratio of a single measurement.

In certain cases, such as shallow marks, or marks with large background signals, it might even be required to improve the signal to noise ratio in order to get accurate alignment results.

In such cases a measurement beam with a single wavelength may be preferred, since the reflectivity of the rest of the stack is wavelength dependant.

Different colors also will be produced by different light sources. Although combining different colors reduces the influence of laser noise on the alignment signal, it cannot completely eliminate the influence.

SUMMARY

It is desirable to provide an improved alignment measurement system for measuring an alignment target on an object. It is desirable for an alignment measurement to have a better signal to noise ratio. It is also desirable to provide an alternative alignment measurement system.

An embodiment of the invention provides an alignment measurement system for measuring an alignment target on an object. The system includes an illumination source to provide a measurement beam towards the object. A detector system receives the measurement beam after it has been reflected from the object. A processing unit determines alignment on the basis of a signal from the detector system. In the detector system, a beam splitting device splits the measurement beam into a first beam part and a second beam part, and a polarizing device polarizes or changes polarization of the first beam part and/or the second beam part, whereby resulting polarization angles of the first and second beam parts are different. The detector system includes a first detector to receive the first beam part and a second detector to receive the second beam part. The processing unit is configured to determine alignment on the basis of a signal representing a comparison of the polarized first beam part and the polarized second beam part.

According to an embodiment of the invention, there is provided a lithographic apparatus including an alignment measurement system as described above.

According to an embodiment of the invention, there is provided a method to determine alignment of a substrate in a lithographic apparatus. The method includes:

generating a measurement beam;

illuminating an alignment target on the substrate with the measurement beam;

splitting a reflected measurement beam reflected from the alignment target into first and second beam parts;

polarizing or changing polarization of the first beam part and/or the second beam part, whereby their respective polarization angles are different;

comparing a first measurement signal based on the first beam part and a second measurement signal based on the second beam part to determine alignment of the substrate.

According to an embodiment of the invention, there is provided an alignment measurement system for measuring an alignment target on an object. An illumination source provides, towards the object, a measurement beam pulse including light of multiple wavelengths. A detector system receives the measurement beam pulse reflected from the object. A processing unit determines alignment on the basis of the measurement beam pulse received by the detector system. The detector system includes a first detector and a dispersive fiber. The dispersive fiber is arranged to guide at least a part of the reflected measurement beam pulse towards the first detector so that different wavelengths of said measurement beam pulse are dispersed in said dispersive fiber and reach the first detector at different moments in time.

According to an embodiment of the invention, there is provided a lithographic apparatus including an alignment measurement system including a dispersive fiber as described above.

According to an embodiment of the invention, there is provided a method to determine alignment of a substrate in a lithographic apparatus. The method includes:

illuminating an alignment target on the substrate with a measurement beam pulse comprising light of multiple wavelengths;

receiving by a detector system the measurement beam pulse after reflection from the object;

guiding at least a part of the measurement beam pulse through a dispersive fiber towards a first detector of the detector system so that different wavelengths of said measurement beam pulse are dispersed in said dispersive fiber and reach the first detector at different moments in time; and determining by a processing unit alignment on the basis of a signal from the first detector.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
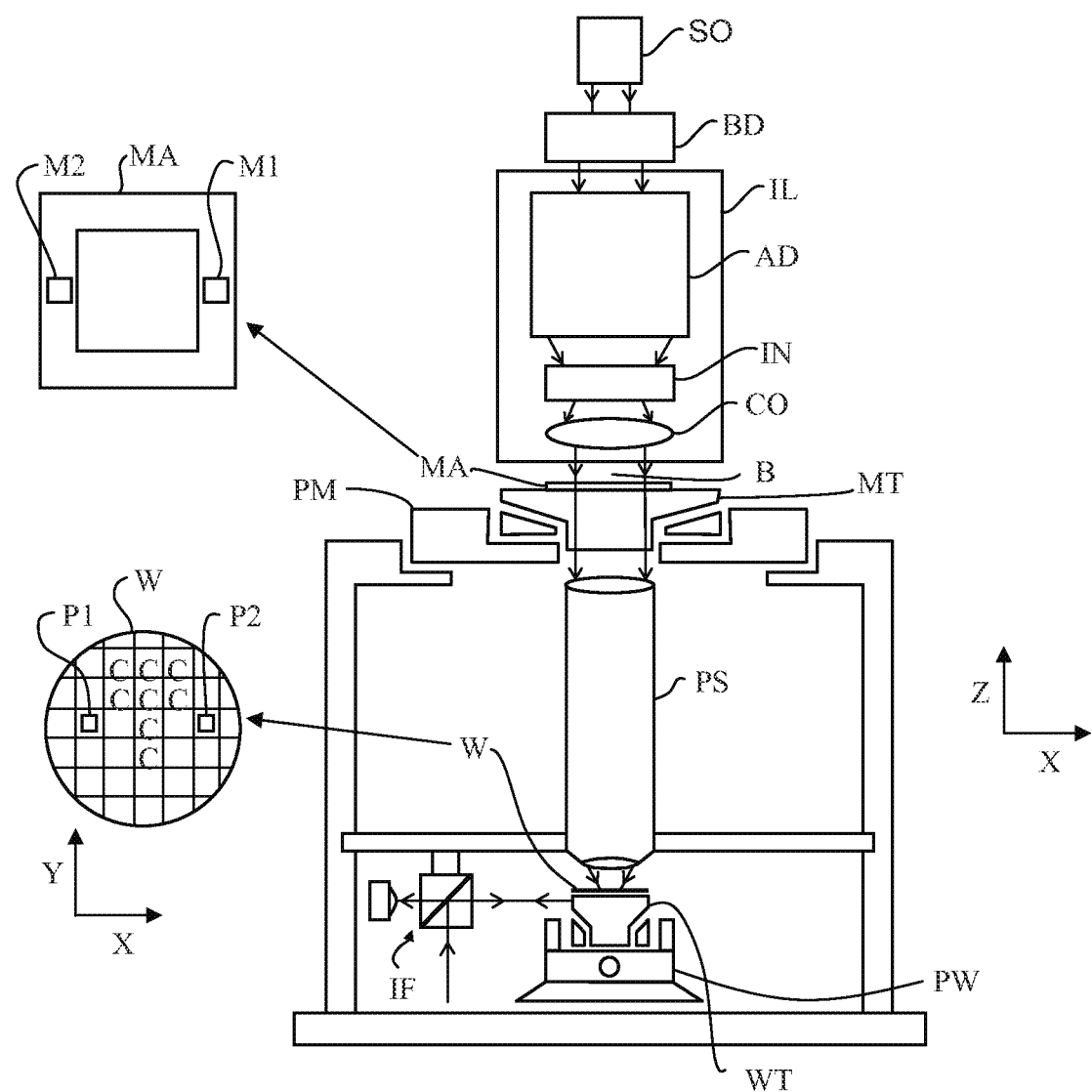
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The illustrated and described apparatus can be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
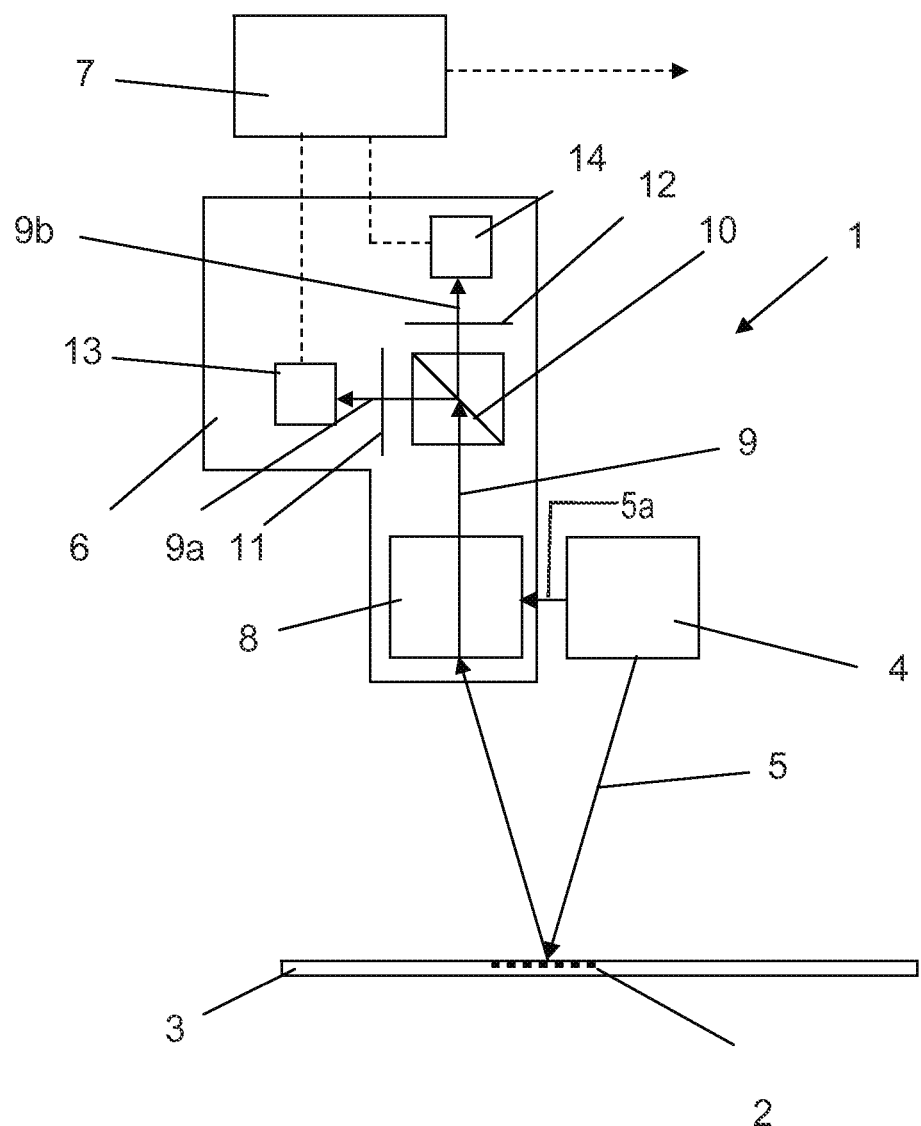
FIG. 2 depicts schematically a side view of an alignment sensor system according to the invention.

FIG. 2 shows an alignment measurement system, generally indicated by reference numeral 1, for measuring an alignment target in the form of an alignment mark 2 (also referred to as a "target") on a substrate 3. The alignment measurement system 1 includes an illumination source 4, for instance a laser source, to provide a measurement beam 5, an incident measurement beam, towards the substrate 3, and a detector system 6 to receive the measurement beam 5, a reflected measurement beam, after reflection from substrate 3.

The alignment measurement system 1 further comprises a processing unit 7 to determine alignment on the basis of the measurement beam 5 reflected by alignment mark 2 and received by the detector system 6. The illumination source 4, the detector system 6, and/or the processing unit 7 may be separate units, or may be integrated in a single unit. The processing unit 7 may be a dedicated processing unit, or may be integrated in another processor of the lithographic apparatus, such as a central processing unit of the lithographic apparatus.

Illumination source 4 provides a continuous measurement beam 5 having a single wave length. The measurement beam is polarized at a 45 degrees angle. This angle may for instance be defined with respect to sub-segmentation direction in the alignment mark, the scan direction or the stage orthogonal system, or any other suitable reference.

In alternative embodiments the illumination source may produce a measurement beam comprising multiple wavelengths, for example "white light", i.e. a mixture of the colors of the visible spectra. The measurement beam 5 may be a polarized or non-polarized light beam, and the measurement beam 4 may be a pulsed or a continuous beam.

The detector system 6 comprises an interferometer unit 8, wherein the reflected measurement beam 5 is joined with a reference beam 5a resulting in a combined measurement beam 9 having intensity variations representative for the measurement of the alignment mark 2. Interferometer units, such as interferometer unit 8, are known even though the application of such an interferometer unit as described herein is new.

The combined measurement beam 9 is guided towards a beam splitting device 10. In the beam splitting device 10, for instance a semi-transparent mirror, the combined measurement beam 9 is split in a first measurement beam part 9a and a second measurement beam part 9b. The first measurement beam part 9a is guided to a first polarizing device 11 configured to change the polarizing angle from 45 degrees to 0 degrees, while the second measurement beam part 9b is guided to a second polarizing device 12 configured to change the polarization angle from 45 degrees to 90 degrees. The first and second polarizing devices 11, 12 may for instance be formed by two quarter lambda plates having opposed polarization. From the first polarizing device 11 the first measurement beam part 9a is guided to a first detector 13, and from the second polarizing device 12 the second measurement beam part 9b is guided to a second detector 14. The first detector 13 provides a first detection signal on the basis of the first measurement beam part 9a received by the first detector 13. The second detector 14 provides a second detection signal on the basis of the second measurement beam part 9b received by the second detector 14.

The processing unit is configured to determine alignment of the alignment mark 2 on the basis of intensity variations in the first detection signal and/or the second detection signal.

An advantage of the split-up of the measurement beam in two measurement beam parts with different polarizations, is that by comparison of the first and the second detection signals, for instance by subtracting the first and second detection signals, the noise induced by layers on the substrate other than the layer(s) of the alignment mark 2 may be eliminated, as will be explained with reference to FIG. 3.

Figure 3:
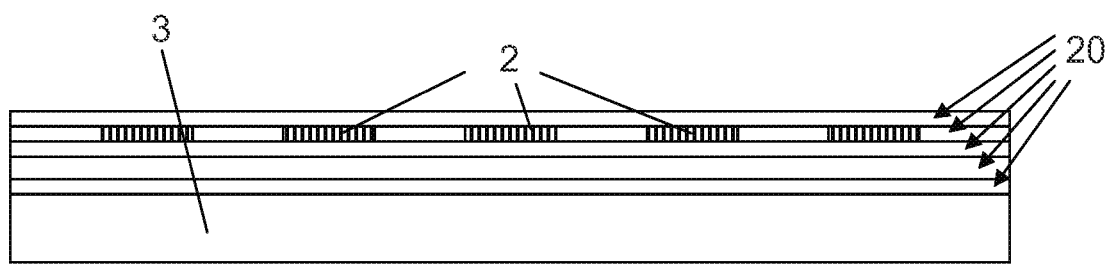
FIG. 3 depicts schematically the cross section of different layers on a substrate.

In FIG. 3 several layers 20 on a substrate 3 are shown. In one of the layers 20, the alignment mark 2 is provided. In the measurement beam, noise will be introduced when the measurement beam passes the different layers 20 or is reflected on one of the layers 20. In different polarization angles within the measurement beam this noise effect will normally be similar. However, when a suitable alignment mark 2 is chosen the effect of the alignment mark 2 on the measurement beam may be different in different polarization directions.

The detection signals provided by the detectors 13, 14 are based on the first and second beam parts having different polarizations. These detection signals are compared with each other in the processing unit, for instance by subtraction. As a result, the noise levels with substantially the same level in both beam parts, i.e. the noise level caused by the different layers 20 will be cancelled or at least substantially reduced. In contrast, the intensity variations due to the reflection on the alignment mark 2 of the measurement beam parts with different polarizations as received by the first detector 13 and the second detector 14 will have different values. Comparison, for example by subtracting of the detection signals will not result in cancelling of the detection signals, but in a signal representative for alignment of the alignment mark 2. On the basis of this signal the alignment of the substrate may be determined.

The polarization directions of the first and second measurement beam parts can be chosen to have an optimal difference between the signals. In an embodiment, one measurement beam part is polarized to a beam part with a transverse-magnetic (TM) wave, also indicated as having a p-like electric field, or as p-polarized, pi-polarized, or tangential plane polarized, and the other measurement beam part is polarized to a beam part with a transverse-electric (TE) wave, also indicated as having an s-like electric field, or as s-polarized, sigma-polarized or sagittal plane polarized.

In order to obtain proper results, a sub-segmented alignment mark could be used that provides sufficiently high signal differences between the two polarizations. In an embodiment, such alignment mark 2 may comprise lines with a dense sub-segmentation in one direction in combination with not-sub-segmented spaces.

Figure 4:
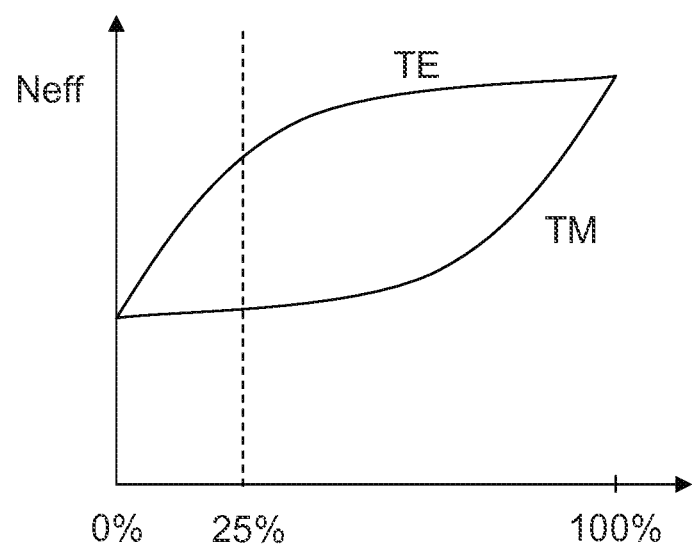
FIG. 4 depicts a diagram showing a relation between Neff and duty cycle of an alignment mark.

For instance, for a certain phase depth, the contrast of an alignment mark is determined by the difference in reflectivity (or effective n: Neff) between line and space of the alignment mark 2. The Neff of a sub-segmented grating varies with changing duty cycle of the sub-segmentation, as shown in FIG. 4. If an alignment mark 2 is made with a duty cycle of 0% in the spaces, and about 25% in the lines, indicated in FIG. 4 by a dashed line, the TM polarization will almost see no alignment signal at all. The alignment signal for TE polarization will be significant, because of the large difference between line and space.

Another advantage of the embodiment of FIG. 2 is that noise of the light source 4 can be substantially eliminated. If the illumination source 4 produces a measurement beam, for instance a polarized light beam under a single angle of for example 45 degrees, with a certain noise level, the measurement beam will be decoupled into two measurement beam parts with different polarizations. Any noise induced by the illumination source 4 will thus end up at a similar level in both the first and the second measurement beam part. As a consequence, this noise term can be eliminated or at least substantially reduced by subtraction or another comparison method of measurement signals obtained from the first and second measurement beam parts.

Figure 5:
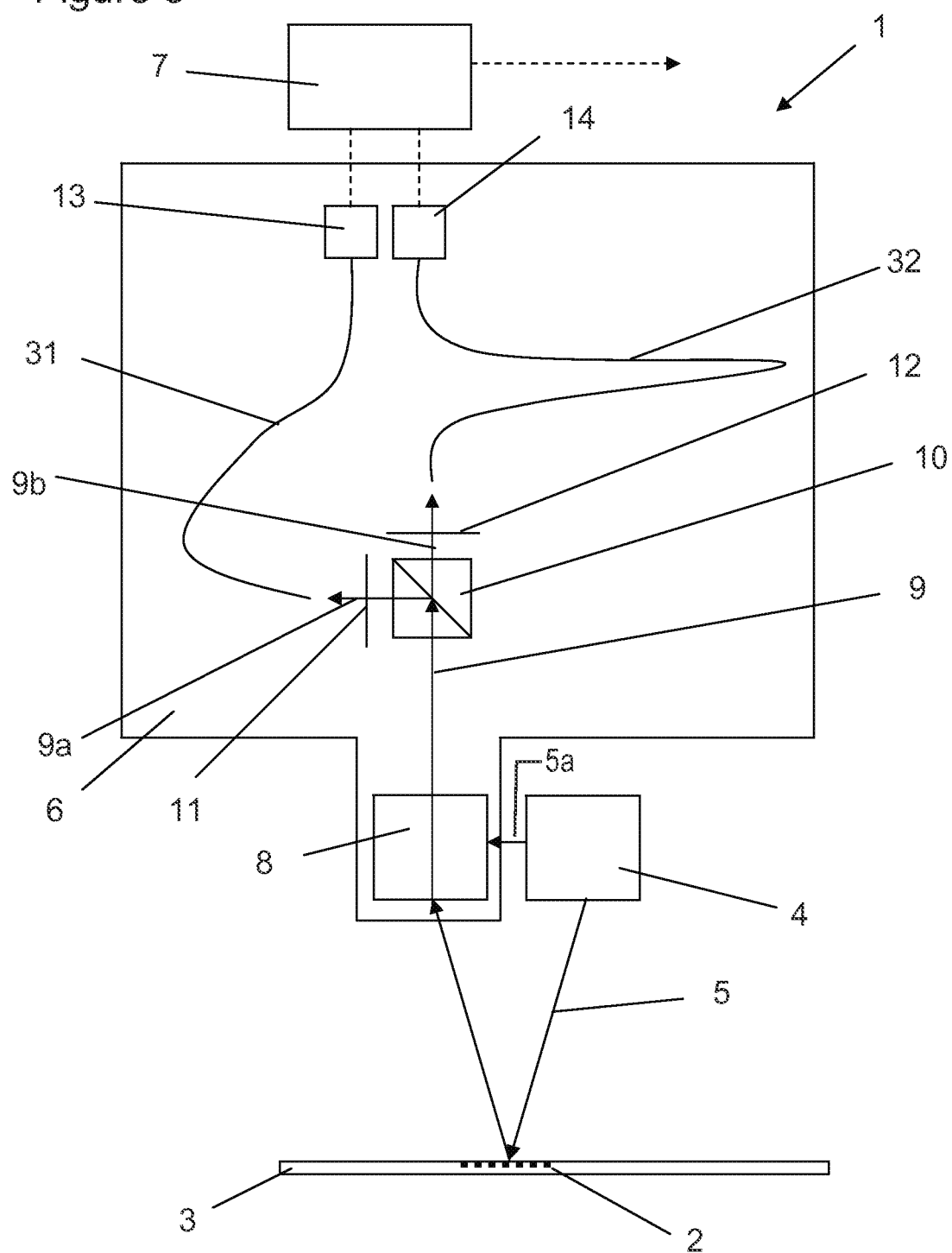
FIG. 5 depicts schematically an alternative embodiment of an alignment sensor according to the invention.

FIG. 5 shows an alternative embodiment of an alignment measurement system 1 according to the invention. Parts of the measurement system which are the same or similar to the parts of the measurement system 1 of FIG. 2 are indicated by the same reference numerals.

The alignment measurement system 1 comprises an illumination source 4 to provide a measurement beam 5, an incident measurement beam toward alignment mark 2. A detector system 6 is arranged to receive the measurement beam 5, a reflected measurement beam, after reflection from alignment mark 2 on the substrate 3.

The alignment measurement system 1 further comprises a processing unit 7 to determine alignment on the basis of the reflected measurement beam 5 received by the detector system 6.

In the embodiment of FIG. 5, the illumination source 4 provides a pulsed white light laser measurement beam 5, i.e. a mixture of colors of the visible spectra. The measurement beam 5 is polarized at a 45 degrees angle. This angle may for instance be defined with respect to sub-segmentation direction in the alignment mark, the scan direction or the stage orthogonal system. Any other suitable polarization angle may also be used.

The detector system 6 comprises an interferometer unit 8, wherein the reflected measurement beam 5 is joined with a reference beam 5a resulting in a combined measurement beam 9 having intensity variations representative for the measurement of the alignment mark 2.

The combined measurement beam 9 is guided towards the beam splitting device 10 to split the beam in two measurement beam parts 9a, 9b, after which each of the measurement beam parts 9a, 9b is guided to one of the first and the second polarizing devices 11, 12. The first and second polarizing devices 11, 12 are configured to polarize the beam parts 9a, 9b in different directions, for example −45 degrees and +45 degree or parallel/orthogonal to the above indicated reference.

The first polarized measurement beam part 9a is received by a first dispersive fiber 31, and the second measurement beam part 9b is received by a second dispersive fiber 32. The first dispersive fiber 31 leads to a first detector 13 and the second dispersive fiber 32 leads to a second detector 14. Due to the length of the dispersive fibers 31, 32 the different wavelengths in the pulse of light will be separated in time. For more details on this effect, reference is made to Nature Vol.

458 (2009), p. 1145-1150, the contents of which is herein incorporated by reference. As a result, the intensity variations of different wavelengths will arrive at the first detector 13 and second detector 14 at different moments in time. By selecting the correct time after an initial measurement beam pulse of the illuminations source 4, the measured intensity received by the first detector 13 and second detector 14 can be matched with the respective wavelength. In this way, an intensity variation response can be obtained for the different wavelengths of the measurement beam 5.

To match the correct wavelength with the correct time after an initial pulse, the alignment measurement system 1 should be calibrated. Such calibration can be performed by determining the time required for a certain wavelength to reach the first or second detector 13, 14, after a pulse being released by the illumination source 4.

In the processing unit 7, a boxcar integrator function can be used to analyze intensity of the signals of the first detector and the second detector as a function of time. A boxcar integrator function method as such is known.

An advantage of the embodiment of FIG. 5 is that different wavelengths of a single pulse of white light can be analyzed by a single detector 13, 14. The intensity variation in time received by the detectors 13, 14, is a function of the wavelength. By proper processing in the processing unit all wavelength-polarization dependent reflectivities of the alignment marks can be obtained in one single pulse of the illumination source. This allows for more useful alignment information and hence improved process robust aligned positions.

It is remarked that a dispersive fiber and its associated effect as described above may also be applied in an alignment measurement system, wherein the combined measurement beam 9 is not split up in two or more measurement beam parts 9a, 9b. In such system the combined measurement beam 9 can be guided through a dispersive fiber to disperse the intensity variations of different wavelengths and measure these intensities by a single detector in dependence of time, and thus wavelength.

Furthermore, the embodiment of FIG. 5 has the advantage of noise reduction or cancellation by splitting the measurement beam in two measurement beam parts having different polarizations and comparing, for instance subtracting the detection signals resulting from the two measurement beam parts. This noise may be noise resulting from the illumination source 4 and/or noise resulting from different layers 20 on the substrate 3.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An alignment measurement system for measuring an alignment target on an object, comprising:
    an illumination source configured to provide a measurement beam towards the object;
    a detector system configured to receive a reflected measurement beam from the object, the detector system comprising:
        an interferometer configured to combine the reflected measurement beam and a reference beam from the illumination source into a combined measurement beam,
        a beam splitting device configured to split the combined measurement beam into a first beam part and a second beam part,
        a first detector configured to receive the first beam part,
        a second detector configured to receive the second beam part, and
        a polarizing device configured to polarize or change polarization of at least one of the first beam part and the second beam part, wherein a resulting polarization angle of the first beam part is different than a resulting polarization angle of the second beam part; and
    a processing unit configured to determine alignment based on a comparison of the polarized first beam part and the polarized second beam part.

2. The system of claim 1, wherein the illumination source is configured to provide a polarized measurement beam.

3. The system of claim 1, wherein the illumination source provides a measurement beam comprising multiple wavelengths.

4. The system of claim 1, wherein the illumination source provides a measurement beam having a single wavelength.

5. The system of claim 1, wherein the illumination source provides a pulsed measurement beam.

6. The system of claim 1, wherein the polarizing device comprises a first polarizing device to polarize or change polarization of the first beam part and a second polarizing device to polarize or change polarization of the second beam part.

7. The system of claim 1, wherein the detector system comprises for each of the first and second beam parts a dispersive fiber between the beam splitting device and respective detectors.

8. The system of claim 7, wherein the first and second detectors are configured to measure intensities of the first and second beam parts, respectively.

9. The system of claim 8, including an arrangement for subtracting intensities measured by the second detector from intensities measured by the first detector.

10. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   an alignment measurement system comprising:
      an illumination source configured to provide a measurement beam towards the object;
      a detector system configured to receive a reflected measurement beam from the object, the detector system comprising:
         an interferometer configured to combine the reflected measurement beam and a reference beam from the illumination source into a combined measurement beam,
         a beam splitting device configured to split the combined measurement beam into a first beam part and a second beam part,
         a first detector configured to receive the first beam part,
         a second detector configured to receive the second beam part, and
         a polarizing device configured to polarize or change polarization of at least one of the first beam part and the second beam part, wherein a resulting polarization angle of the first beam part is different than a resulting polarization angle of the second beam part; and
      a processing unit configured to determine alignment based on a comparison of the polarized first beam part and the polarized second beam part.

11. A method to determine alignment of a substrate in a lithographic apparatus, comprising:
   generating a measurement beam;
   illuminating an alignment target on the substrate with the measurement beam;
   combining a reflected measurement beam reflected from the alignment target and a reference beam into a combined measurement beam;
   splitting the combined measurement beam into first and second beam parts;
   polarizing or changing polarization of at least one of the first beam part and the second beam part, wherein their respective polarization angles are different; and
   comparing a first measurement signal based on the first beam part and a second measurement signal based on the second beam part to determine alignment of the substrate.

12. The method of claim 11, wherein the alignment target is sub-segmented to increase a signal difference between the first and second beam parts.

13. The method of claim 12, wherein the alignment target comprises lines and spaces, wherein the lines are sub-segmented.

* * * * *